(12) United States Patent
Cazaux et al.

(10) Patent No.: US 9,040,916 B2
(45) Date of Patent: May 26, 2015

(54) VISIBLE AND NEAR-INFRARED RADIATION DETECTOR

(75) Inventors: Yvon Cazaux, Grenoble (FR); Benoit Giffard, Grenoble (FR); Xavier Hugon, Voiron (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 13/882,914

(22) PCT Filed: Nov. 3, 2011

(86) PCT No.: PCT/FR2011/000588
§ 371 (c)(1),
(2), (4) Date: May 1, 2013

(87) PCT Pub. No.: WO2012/059657
PCT Pub. Date: May 10, 2012

(65) Prior Publication Data
US 2013/0214160 A1    Aug. 22, 2013

(30) Foreign Application Priority Data
Nov. 3, 2010   (FR) ...................... 10 04317

(51) Int. Cl.
*G01J 5/20*     (2006.01)
*H01L 27/14*    (2006.01)
(Continued)

(52) U.S. Cl.
CPC ............ *G01J 5/20* (2013.01); *H01L 27/14621* (2013.01); *H01L 27/14634* (2013.01);
(Continued)

(58) Field of Classification Search
CPC .......................................... G01J 5/20
USPC ............................... 250/338.4, 330
See application file for complete search history.

(56) References Cited

U.S. PATENT DOCUMENTS 4,547,074 A  * 10/1985 Hinoda et al. ............... 356/405
5,373,182 A    12/1994 Norton
(Continued)

FOREIGN PATENT DOCUMENTS

EP    0 146 375 A2    6/1985
EP    0 809 298 A1    11/1997
(Continued)

OTHER PUBLICATIONS

U.S. Appl. No. 13/882,944 in the name of Cazaux et al. filed May 1, 2013.
(Continued)

*Primary Examiner* — David Porta
*Assistant Examiner* — Abra Fein
(74) *Attorney, Agent, or Firm* — Oliff PLC

(57) ABSTRACT

The visible and near-infrared radiation detector includes a near-infrared photosensitive element, a readout circuit for reading the near-infrared photosensitive element, four visible photosensitive elements, one of which being placed facing the near-infrared photosensitive element, and three interference filters to define a pixel quadruplet. A first pixel, including the near-infrared photosensitive element and one of the visible photosensitive elements, has no filter. The three other pixels, respectively including the three other visible photosensitive elements, are respectively provided with filters associated with the three primary colors. Each interference filter includes an alternation of metal layers and of dielectric layers.

6 Claims, 6 Drawing Sheets

(51) Int. Cl.
  *H01L 31/00* (2006.01)
  *H01L 27/146* (2006.01)
  *H01L 31/18* (2006.01)

(52) U.S. Cl.
  CPC .... *H01L 27/14636* (2013.01); *H01L 27/14647* (2013.01); *H01L 27/14685* (2013.01); *H01L 27/1469* (2013.01); *H01L 27/14625* (2013.01); *H01L 31/18* (2013.01); *H01L 27/1464* (2013.01); *H01L 27/14641* (2013.01)

(56) References Cited

U.S. PATENT DOCUMENTS

| | | | |
|---|---|---|---|
| 5,619,357 | A | 4/1997 | Angelopoulos et al. |
| 5,808,350 | A | 9/1998 | Jack et al. |
| 6,107,618 | A | 8/2000 | Fossum et al. |
| 6,198,147 | B1 | 3/2001 | Connolly |
| 2004/0032518 | A1 | 2/2004 | Benjamin et al. |
| 2004/0125222 | A1 | 7/2004 | Bradski et al. |
| 2006/0146233 | A1 | 7/2006 | Park |
| 2007/0187794 | A1 | 8/2007 | Fukuyoshi et al. |
| 2009/0200589 | A1 | 8/2009 | Qian et al. |
| 2010/0026865 | A1 | 2/2010 | Tivarus et al. |
| 2010/0044821 | A1 | 2/2010 | Noma et al. |
| 2010/0102366 | A1 | 4/2010 | Lee et al. |

FOREIGN PATENT DOCUMENTS

| | | |
|---|---|---|
| EP | 2 117 047 A1 | 11/2009 |
| EP | 2 180 513 A1 | 4/2010 |
| FR | 2 904 432 A1 | 2/2008 |

OTHER PUBLICATIONS

Koyama et al., "A day and night MOS imager spectrally adjusted for a wide range of color temperatures," *Sensors, Cameras, and Systems for Industrial/Scientific Applications X*, SPIE, vol. 7249, pp. 1-8, 2009.

Chen et al., "Wafer-scale 3D integration of InGaAs image sensors with Si readout circuits," IEEE International Conference on 3D System Integration, 3DIC, pp. 1-4, 2009.

\* cited by examiner

VISIBLE AND NEAR-INFRARED RADIATION DETECTOR

BACKGROUND OF THE INVENTION

The invention relates to low lighting level imaging, and more specifically to a detector of visible and near-infrared radiation.

STATE OF THE ART

In night vision or for a low lighting level, the amount of visible light (wavelength from 0.4 µm to 0.7 µm) is generally insufficient to perform a conventional image capture. A sensor having a spectral response extending beyond the visible spectrum is then used. Thus, the amount of captured light is increased, which enables to obtain a more detailed image.

In other words, a detection material having a high sensitivity for wavelengths greater than 0.7 µm, that is, a material sensitive to infrared, and more specifically to near-infrared, is desired. By definition, the sensitivity of a sensor corresponds to the ratio of the output signal of the detector to the normalized incident light intensity. It is a function of the wavelength. Near-infrared approximately corresponds to the spectral range of wavelengths from 0.7 µm to 1.8 µm.

In the visible range, silicon has high detection performances and forms the basic material of current image sensors. However, given the width of its bandgap (1.1 eV), the sensitivity of silicon decreases in the near-infrared range between 700 and 1000 nm. This decrease may be partly compensated by increasing the silicon layer thickness. As an example, a silicon layer having a 10-µm thickness enables to absorb close to 90% of a radiation at a 0.65-µm wavelength. However, for $\lambda$=0.9 µm, a layer having a 100-µm thickness is necessary. Further, silicon is transparent to radiations having a wavelength greater than 1 µm. Its use as a near-infrared detection material is thus limited.

The materials optimized for the detection of near-infrared radiations are semi-conductor materials having a small bandgap ($E_G$<0.8 eV), such as gallium indium arsenide (InGaAs) or germanium. An InGaAs layer having a 0.5 µm thickness for example enables to absorb 90% of a light flow at a 0.9-µm wavelength.

FIG. 1 represents two substrates 2a and 2b enabling to form an InGaAs-based image sensor according to article ["Wafer-scale 3D integration of InGaAs image sensors with Si readout circuits", Chen et al., IEEE International Conference on 3D System Integration, 3DIC pp. 1-4, 2009].

Substrate 2a, on the left-hand side, comprises an indium phosphide layer 4 (InP). InP layer 4 allows the epitaxial growth of a stack 6 successively comprising an n-type doped InP layer, an intrinsic InGaAs absorption layer, and an intrinsic InP layer. For clarity, the layers of stack 6 are not shown in FIG. 1. An upper area 8 of stack 6 (corresponding to the intrinsic InP layer) is locally p-type doped to form a photosensitive PIN diode (p-InP/i-InGaAs/n-InP). A metallization 10 is deposited on area 8 to form an electric contact of the photodiode. Metallization 10 is then covered with a layer 12 of dielectric material.

Substrate 2b, on the right-hand side, is of silicon-on-insulator type (SOI). It comprises a thin silicon layer 14 separated from a support layer 16 by a buried oxide layer 18. Transistors 20 are formed in silicon layer 14, and then connected together by interconnects 22 to form a readout circuit. A dielectric material layer 24 generally covers transistors 20 and interconnects 22.

FIG. 2 represents the completed InGaAs-based image sensor. Substrate 2b provided with the readout circuit is transferred by bonding to the photodiode of substrate 2a. The bonding is performed at the level of dielectric layers 12 and 24. InP layer 4 and support layer 16 are removed. Finally, the photodiode is connected to the readout circuit by interconnection vias 26a and 26b.

The InGaAs sensor shown in FIG. 2 is optimized for near-infrared detection. It is further possible to extend the spectral response of InGaAs in the visible spectrum by varying the thicknesses of the layers of the materials forming it. However, the performances are lower than those of silicon. InGaAs is thus not optimized for visible detection.

U.S. Pat. No. 5,808,350 describes a sensor of visible, near-infrared (NIR), and infrared (MWIR/LWIR: "mid/long wavelength infrared") radiation. An InGaAs layer is bonded to the backside of a silicon substrate to form a heterojunction. A thermally-insulated bolometer is placed above the frontside of the silicon substrate.

The sensor is illuminated from the backside of the silicon substrate. The visible and near-infrared radiation from 400 nm to 1800 nm is absorbed by the InGaAs layer while the far-infrared (or mid-wavelength) radiation crosses the heterojunction and the silicon substrate, to be captured by the bolometer. The charges photogenerated in the InGaAs layer (visible and NIR) cross the heterojunction and are collected in the silicon substrate.

Such a sensor is complex to produce. In particular, the forming of an InGaAs/Si heterojunction to detect near-infrared radiation is difficult to control. Further, the delimitation of the heterojunction by etching generates significant leakage currents.

Document US2009/200589 describes a backside illuminated visible and infrared image sensor. The sensor comprises a silicon substrate having a visible photodiode and a readout circuit formed therein. The silicon substrate is topped with an infrared detection layer comprising a hydrogenated amorphous silicon photodiode (a-Si:H). The visible radiation is absorbed by the substrate and captured by the silicon photodiode. The infrared radiation crosses the substrate, and is then captured by the hydrogenated amorphous silicon photodiode. The sensor is further provided with color filters.

This visible and near-infrared sensor has a poor performance. Indeed, hydrogenated amorphous silicon has sensitivity in near-infrared which is even lower than that of crystal silicon. This type of material is further transparent to radiation of wavelengths greater than 800 nm. Furthermore, this sensor does not enable to obtain a good color rendering.

SUMMARY OF THE INVENTION

A need therefore exists to provide a visible and near-infrared detector which is easy to produce and has a high performance, especially in terms of sensitivity and of color rendering.

This need tends to be satisfied by providing a near-infrared photosensitive element formed in a layer of a material optimized for near-infrared detection, a readout circuit for reading the near-infrared photosensitive element formed on a frontside of a silicon substrate, the frontside of the substrate being covered with the layer of material optimized for near-infrared detection. The detector further comprises four visible photosensitive elements formed in the silicon substrate, one of them being arranged in front of the near-infrared photosensitive element, and three interference filters at the backside of the silicon substrate to define a pixel quadruplet. A first pixel, comprising the near-infrared photosensitive element and one of the visible photosensitive elements, is devoid of filter. The three other pixels, respectively comprising the three other visible photosensitive elements, are respectively provided with filters associated with the three elementary colors. Each interference filter comprises an alternation of metal layers and of dielectric layers.

A method for producing a detector of visible and near-infrared radiation is also provided. The method comprises the steps of:

providing a layer made of a material optimized for near-infrared detection provided with a near-infrared photosensitive element;

forming a contact metallization of the near-infrared photosensitive element on a frontside of the layer of the material optimized for near-infrared detection;

providing a silicon substrate provided with a visible photosensitive element;

covering the frontside of the silicon substrate with an interconnect layer while leaving a last metallization level exposed;

placing into contact the frontsides of the layer of the material optimized for near-infrared detection and of the silicon substrate; and performing a metal-to-metal bonding of the last metallization level of the interconnect layer with the contact metallization of the near-infrared photosensitive element.

BRIEF DESCRIPTION OF THE DRAWINGS

Other advantages and features will become more clearly apparent from the following description of particular embodiments of the invention given for non-restrictive example purposes only and represented in the appended drawings, in which.

DESCRIPTION OF A PREFERRED EMBODIMENT OF THE INVENTION

It is desired to have a detector combining a visible image and a near-infrared image (NIR: 0.7 µm<λ<1.6 µm). Such an association enables to view a scene in low lighting conditions.

Figure 3:
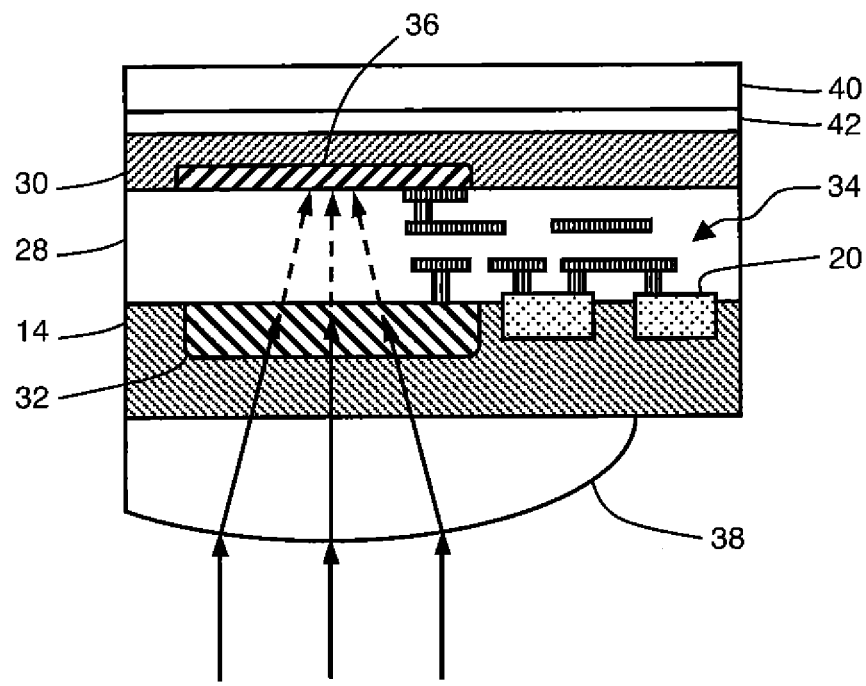
FIG. 3 represents a first embodiment of a detector of visible and near-infrared radiation according to the invention.

FIG. 3 schematically represents a first embodiment of a detector of visible and near-infrared radiation. The detector successively comprises a silicon substrate 14, an interconnect layer 28, and a substrate 30 comprising at least one layer optimized for the detection of near-infrared radiation.

Silicon substrate 14 comprises a photodiode 32 and transistors 20. Transistors 20 are formed on a frontside of substrate 14 and covered with interconnect layer 28. Layer 28 is formed of metal tracks embedded in a dielectric material transparent to infrared radiation, for example, an oxide layer of PSG type (PSG, "Phosphosilicate glass"). The metal tracks interconnect transistors 20 and electrically connect them to photodiode 32 to form a readout circuit 34 of photodiode 32.

Substrate 30 preferably comprises a stack of layers made of materials sensitive to near-infrared to form a photodiode 36. The stack for example comprises an n-type doped InP layer, an intrinsic InGaAs absorption layer, and a p-type doped InP layer. In this case, the maximum sensitivity of the photodiode is defined by the InGaAs absorption layer.

In this embodiment, NIR photodiode 36 is associated with a readout circuit (not shown in FIG. 3) formed in silicon 14 and separate from circuit 34. The photogenerated charge carriers originating from photodiodes 32 and 36 are then integrated separately. The luminosity levels of the photodiodes are read separately and may be treated independently, or merged outside of the detector, for example, in an external memory.

The visible and near-infrared radiation, symbolized by the arrows in solid line in FIG. 3, enters the detector through a backside of silicon substrate 14. The visible component of the radiation is captured by photodiode 32.

However, the radiation component corresponding to near-infrared crosses silicon substrate 14. This component, schematized by arrows in dotted lines in FIG. 3, is captured by photodiode 36, placed in front of photodiode 32. The thickness of substrate 14 preferably ranges between 2 µm and 5 µm, to limit near-infrared absorption in the silicon.

In other words, the radiation received by the backside of substrate 14 is divided in two. Each portion is captured by a photodiode optimized for the considered radiation, that is, a photodiode having a high sensitivity. In FIG. 3, silicon photodiode 32 is optimized for visible radiation and InGaAs-based photodiode 36 is optimized for near-infrared radiation. Thus, the combined signal originating from the detector is more intense with respect to a sensor only formed of silicon or of InGaAs, in low lighting conditions.

The metal tracks of layer 28 are preferably offset towards an edge of the photo-sensitive areas. It is thus avoided to obstruct the passing of light and the amount of radiation reflected by metal tracks is decreased.

The detector preferably comprises a microlens 38 arranged on the backside of substrate 14, which focuses the visible and near-infrared radiation on photodiodes 32 and 36. An antireflection layer (not shown) may also be placed on the backside to maximize the amount of light received by the photodiodes.

The thickness of substrate 30 generally ranges between 0.5 µm and 5 µm. Substrate 30 is preferably reinforced by a support substrate 40, for example, made of silicon, electrically insulated from substrate 30 by a passivation layer 42.

Figure 4:
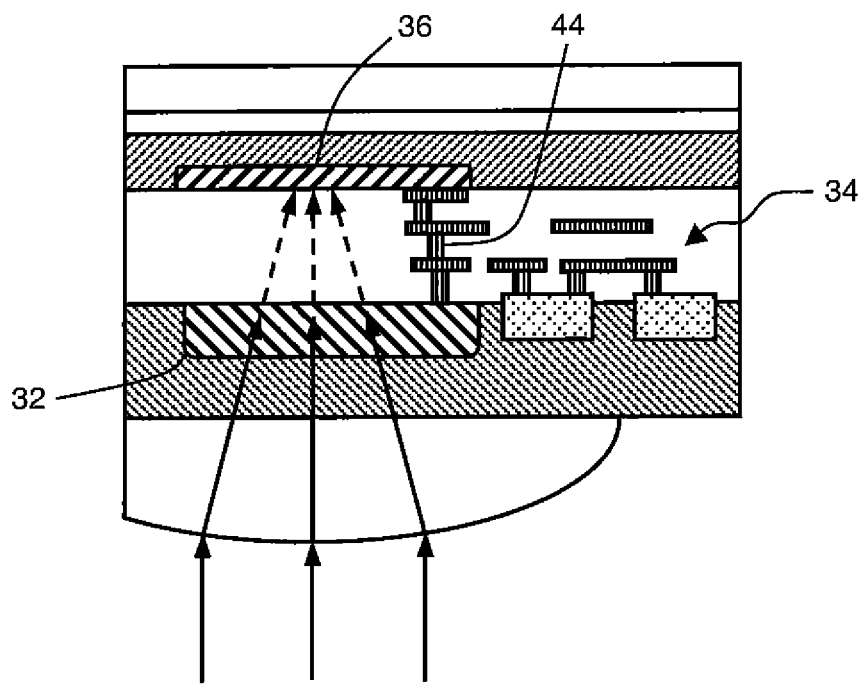
FIG. 4 represents an alternative embodiment of the detector of FIG. 3.

FIG. 4 represents an alternative embodiment of the detector where photodiodes 32 and 36 are interconnected by an electric connection 44. Readout circuit 34 is then shared between photodiodes 32 and 36. The charges generated by photodiodes 32 and 36 are added, thus directly and simply merging the visible light level and the near-infrared level.

Figure 5:
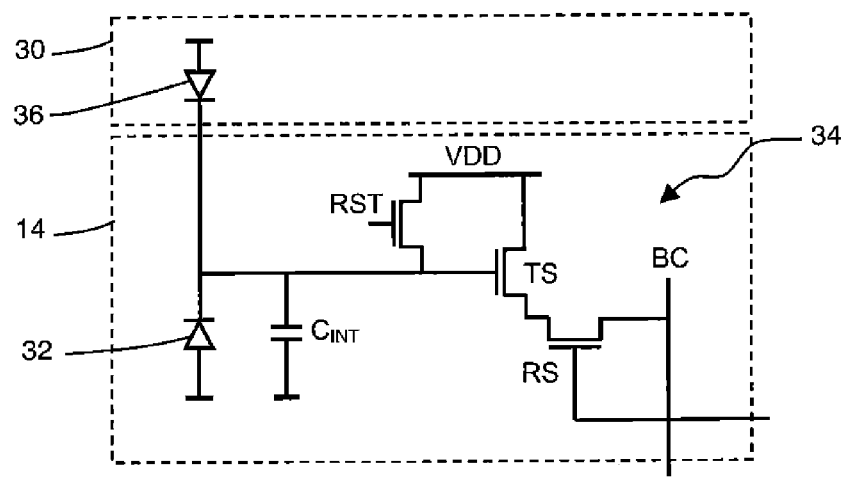
FIG. 5 represents an electric diagram of a pixel corresponding to the detector of FIG. 4.

FIG. 5 represents an electric diagram of a pixel corresponding to the detector of FIG. 4. The pixel comprises photodiode 32 of substrate 14 and photodiode 36 of substrate 30, arranged head-to-tail and reverse biased. The photodiodes are in this case connected to a readout circuit 34 of conventional type formed of three transistors: a follower transistor TS, a row selection transistor RS, and a reset transistor RST.

The cathodes of photodiodes 32 and 36 are connected to the gate of follower transistor TS. The intrinsic capacitances of photodiodes 32, 36 and the gate capacitance of transistor TS, electrically connected in parallel, are gathered in a single integration capacitance, noted $C_{INT}$ in FIG. 5. Capacitance $C_{INT}$ enables to accumulate the charges generated by the visible and near-infrared light that strikes photodiodes 32 and 36. Selection transistor RS connects the source of follower transistor TS to a column bus BC. Reset transistor RST connects capacitance $C_{INT}$ to a positive power supply line VDD.

A capacitive transimpedance amplifier (CTIA) may also be used as a readout circuit of one or several photodiodes. A CTIA-type circuit is interesting since it provides a stable biasing of the photodiodes, a low noise level, and a good linearity. It is particularly advantageous for NIR photodiode 36, which has a reverse current that tends to increase rapidly with the junction voltage. However, it takes up a larger pixel surface area than readout circuit 34 illustrated in FIG. 5.

Photodiodes 32 and 36 may also be sequentially read by readout circuit 34. In this case, additional transistors are arranged in series with the photodiodes, to successively connect photodiode 32 and photodiode 36 to readout circuit 34.

The detector of FIG. 3 or 4 is preferably repeated several times to form a pixel array. This image sensor thus obtained superposes an array of NIR photodiodes to an array of visible photodiodes. The visible and near-infrared images, of identical resolution, are merged to increase the detector sensitivity and dynamics in low lighting conditions.

Figure 6:
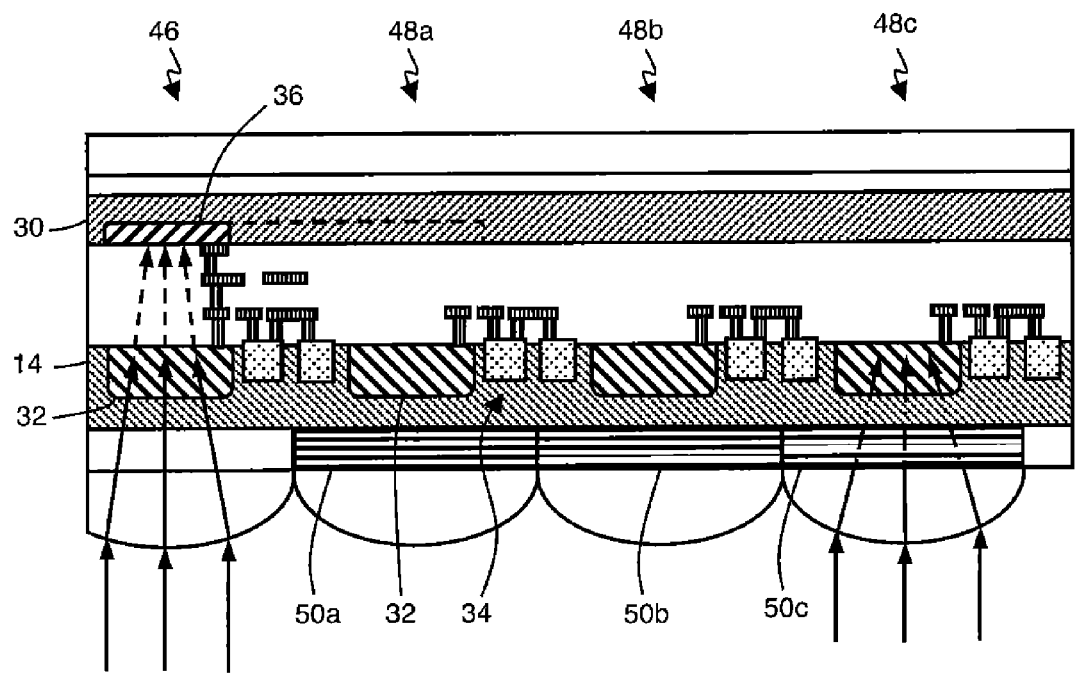
FIG. 6 represents four pixels of a second embodiment of a detector of visible and near-infrared radiation, three of the four pixels being provided with an interference filter associated with an elementary color.

FIG. 6 represents a second embodiment of a visible and near-infrared radiation detector enabling to obtain color in the visible spectrum. The detector comprises a pixel quadruplet. A first pixel 46 comprises a visible photodiode 32, a NIR photodiode 36, and a readout circuit 34. Pixel 46 thus corresponds to the detector of FIG. 3 or 4. The three other pixels 48a, 48b, and 48c each comprise a visible photodiode 32 and an associated readout circuit 34. Pixels 48a, 48b, and 48c are respectively provided with filters 50a-50c associated with the three elementary colors, for example, red (50a), blue (50b), and green (50c). Color filters 50a-50c are arranged between the incident radiation and photodiodes 32, on the backside of substrate 14.

In a conventional silicon color imager, the filter at the level of each pixel is generally made of a pigmented resin. This type of filter transmits part of the visible radiation but also a significant part of the near-infrared radiation to which silicon photodiodes are sensitive up to approximately $\lambda=1$ μm. The near-infrared component is generally suppressed by means of a overall filter arranged upstream of the pixel array. This enables to restore a faithful color image, the signal captured by the pixels in near-infrared may be considered as a parasitic signal which adds to the signals carrying the color information. The color image may also be used without this overall filter, in low lighting conditions. This enables to increase the image dynamics by capturing part of the near-infrared in silicon photodiodes. However, the image colors are altered.

The overall filter is not usable in the applications envisaged herein since the near-infrared radiation is desired to be kept on at least one pixel to increase the detector dynamics.

Color filter 50a-50c is an interference-type filter, such as described in patent FR2904432. The interference filter comprises an alternation of dielectric layers ($SiO_2$, $TiO_2$, $Al_2O_3$ ... ) and of metal layers (Ag, Al, Au ... ). The filter transmission is adjusted by varying the thickness of one or of several dielectric layers. A specificity of this type of filter is that the near-infrared radiation may be cut off, which is not possible for a pigmented resin filter.

It is thus defined color pixels 48a-48c only receiving the visible radiation (shown with a dash-dotted line in FIG. 6) and a pixel 46 having no interference filter and receiving both the visible radiation and the near-infrared radiation.

By repeating this pixel quadruplet, an array of composite visible and near-infrared pixels 46 interleaved in an array of color pixels 48a-48c is obtained. Array of pixels 46 generates a black and white image with a high contrast by capturing more light, while array of pixels 48a-48c generates a visible color image. These two images may then be merged.

The color information in the visible spectrum improves the image readability and the near-infrared information increases the image dynamics. Due to the interference filters, the obtained colors are faithful to those of the scene, which is not true in a conventional imager having no global filter.

In an alternative embodiment of the detector of FIG. 6, the detector comprises an infrared photodiode 36 in pixel 46 and an infrared photodiode 36 in at least one of color pixels 48a-c. Photodiode 36 of the color pixel, which does not see infrared due to interference filter 50a-c, then enables to measure the dark current of the infrared photodiodes. This dark current may then be subtracted from the infrared pixel signal.

Figure 7:
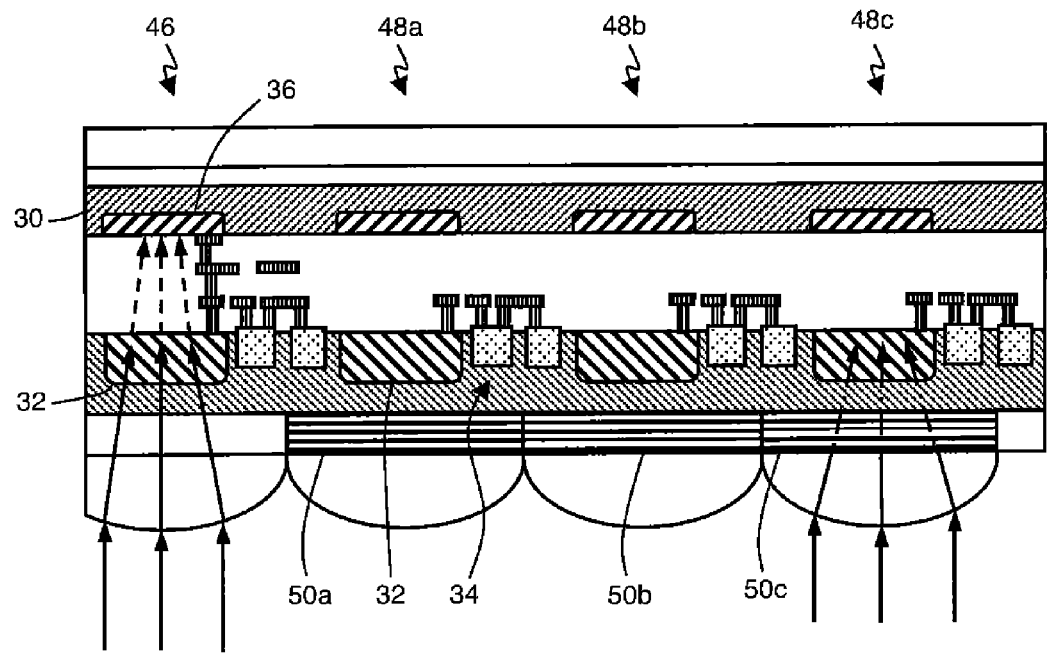
FIG. 7 represents four pixels of an alternative embodiment of the detector of FIG. 6.

FIG. 7 represents another alternative embodiment where the detector comprises four photodiodes 36 aligned on four photodiodes 32. This enables to simplify the manufacturing process, since all pixels are formed in the same way. However, photodiodes 36 of color pixels 48a-48c are inactive since these pixels are provided with individual filters 50a-50c blocking near-infrared. They can thus be disconnected from readout circuits 34. Leaving them connected enables to increase the integration capacity, if desired in certain applications. It may also be provided to connect photodiodes 36 of pixels 48a-48c to a fixed bias voltage, which eliminates the impact of their leakage current on photodiode 36 of pixel 46.

For equal performances, especially in terms of electric charge storage constraints, a NIR photodiode 36 made of InGaAs is significantly larger than a silicon photodiode 32. Thus, if a sensor comprising pixels of identical structure, such as shown in FIG. 7, is formed, the maximum spatial resolution allowed by silicon is not reached for the visible portion.

To increase the spatial resolution in the visible range rather than having photodiodes 36 inactive in color pixels 48a-48c, photodiode 36 of pixel 46 is at least partially extended over one of pixels 48a-48c (shown in dotted lines in FIG. 6), and preferably over all three pixels 48a-48c. In this case, the NIR photodiode may have an optimal size while decreasing the size of the visible photodiodes. Further, this increases the charge storage capacity of photodiode 36, which enables to increase the infrared photodiode saturation threshold, and thus to increase detection dynamics.

Since each quadruplet only comprises a single near-infrared pixel 46, the spatial resolution of the near-infrared image (black and white) is divided by four with respect to a detector only formed of near-infrared pixels (FIG. 3 or 4).

Figure 8:
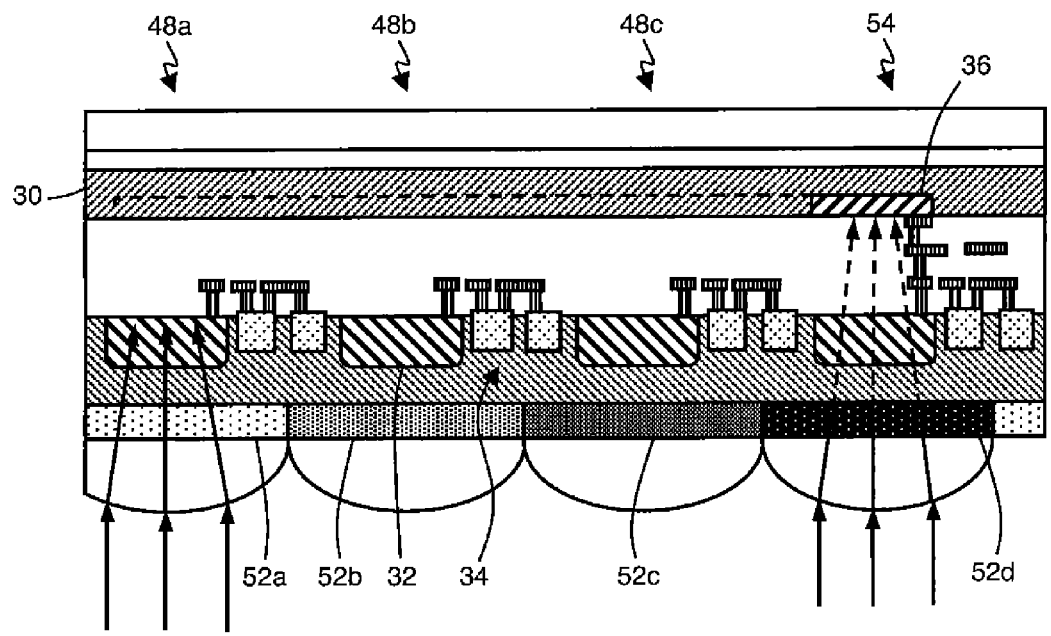
FIG. 8 represents four pixels of a third embodiment of a detector of visible and near-infrared radiation, using color filters made of pigmented resins.

FIG. 8 represents a second embodiment of a color and near-infrared detector which is simpler to form. The interference filters of FIG. 6 are here replaced with resin color filters 52, transparent to near-infrared radiation.

The detector comprises four visible photodiodes 32 and one infrared photodiode 36, which is aligned with one of the visible photodiodes. Three pixels 48a-48c respectively comprise three of the four visible photodiodes 32 and a fourth pixel 54 comprises infrared photodiode 36 and the remaining photodiode 32. Pixels 48a-48c are further provided with a resin filter associated with an elementary color 52a-52c and fourth pixel 54 is provided with a black filter 52d.

The visible and near-infrared radiation crosses filters 52a-52c. In pixels 48a-48c, the filtered visible component is captured by photodiode 32 and the near-infrared component is lost. Conversely, in pixel 54, black filter 52d blocks visible wavelengths and only the near-infrared component of the radiation is captured by photodiode 36.

This detector enables, like that of FIG. 6, to merge a visible color image (obtained by pixels 48a-48c) with a near-infrared image (obtained by pixel 54) to increase the sensitivity in low lighting conditions.

Black filter 52d is made of a pigmented resin formed according to the same techniques as resin color filters 52a-52c, for example, as described in U.S. Pat. No. 5,619,357. The resin comprises a polymer and at least one pigment capable of blocking the visible radiation. The polymer is for example selected from among acrylics, polyparaphenylenes vinylenes, polyanilines, polyazines, polythiophenes, polyparaphenylenes, polyfurannes, and polypyrroles. The pigment preferably is a black fluorinated carbon. The black filter is then simple to form. A mixture of pigments may also be used, for example, equal portions of yellow, purple, and blue pigments, or equal portions of yellow and purple pigments. Preferably, the yellow pigment is based on isoindoline compounds, the purple pigment is based on dioxazine compounds, and the blue pigment is based on copper phthalocyanine compounds.

Photodiode 36 of pixel 54 may also extend over all three color pixels 48a-c (shown in dotted lines in FIG. 8). In this configuration, the infrared radiation in color pixels 48a-c is no longer lost as in FIG. 8, but captured by photodiode 36. This allows a maximum collection of the infrared flux, to further increase the sensitivity.

However, in the embodiment of FIG. 8, the resolution of near-infrared images is low since the detector comprises a single photodiode 36 per pixel quadruplet.

Figure 9:
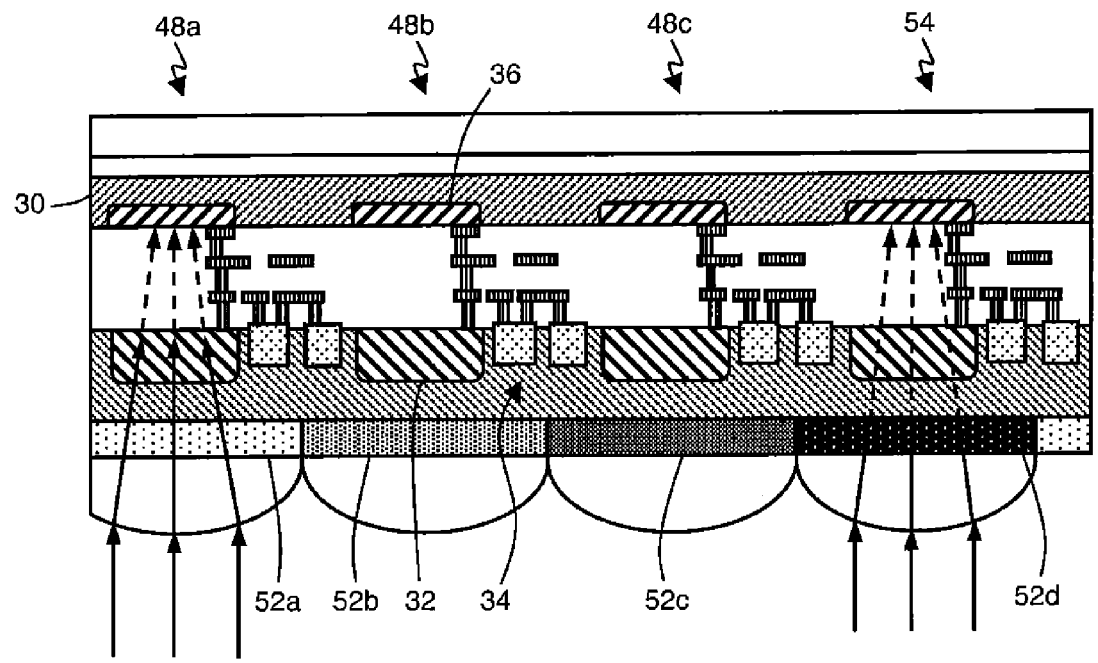
FIG. 9 represents four pixels of an alternative embodiment of the detector of FIG. 8.

FIG. 9 represents an alternative embodiment of the color detector according to FIG. 8, enabling to quadruple the spatial resolution of NIR pixels.

The detector comprises four photodiodes 36 aligned on four photodiodes 32. The four pixels have an identical structure, each comprising a visible photodiode 32, a NIR photodiode 36, and a readout circuit 34.

In this embodiment, the near-infrared image has a maximum resolution, unlike the detectors of FIGS. 6 to 8. Indeed, each pixel comprises a photodiode 36 exposed to near-infrared radiation.

The detectors of FIGS. 8 and 9 may also be used in day and night vision. In day vision, the detector is used as a color image sensor by means of pixels 48a-48c. To reconstruct an image with faithful colors, the near-infrared component of pixel 54 is subtracted from the signals originating from color pixels 48a-48c, to only obtain the visible component. In night vision, photodiode 36 forms a near-infrared image sensor, of simple resolution in the case of FIG. 8 and of full resolution in the case of FIG. 9.

In a practical case, readout circuit 34 of photodiode 32 (and of photodiode 36 if present) is identical for all the pixels of a detector. The circuit with three transistors (FIG. 5) and the CTIA circuit have been previously described for pixels 46 capturing both visible and near-infrared radiations. It may however be envisaged to use a readout circuit of different nature for color pixels 48a-48c of FIGS. 6, 7, 8, and 9.

Figure 10:
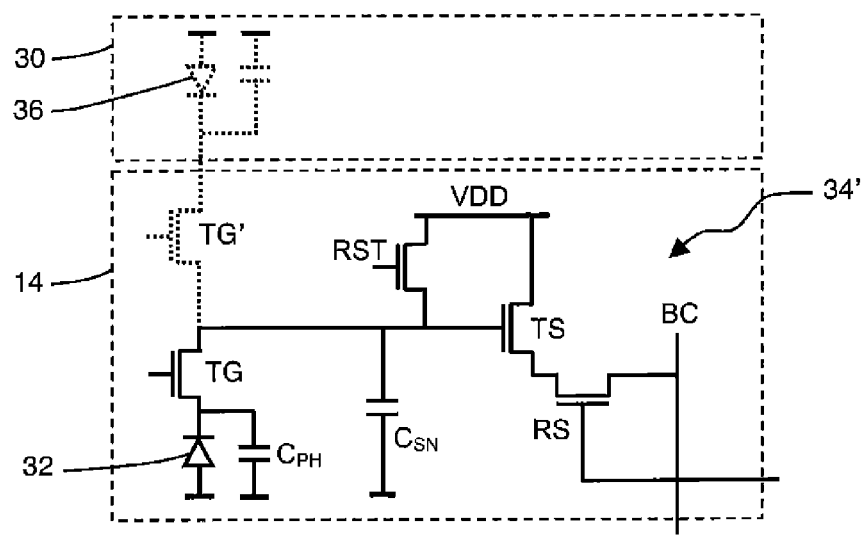
FIG. 10 represents an electric diagram of a color pixel of FIGS. 6, 7, 8, and 9.

FIG. 10 represents a readout circuit 34' optimized for color pixels 48a-48c. Readout circuit 34' comprises an additional transistor with respect to circuit 34 of FIG. 5. Photodiode 32 is separated from follower transistor TS by a transfer transistor TG. Transistor TG ensures the transfer of the charges integrated in intrinsic capacitance $C_{PH}$ of the photodiode to gate capacitance $C_{SN}$ of follower transistor TS.

This readout circuit enables to minimize the temporal noise of the pixel, by performing a correlated double sampling. The principle consists in reading the noise level in capacitance $C_{SN}$ before transferring the useful level from photodiode 32 to capacitance $C_{SN}$. The noise value can thus be subtracted from the value of the read useful signal after transfer. By decreasing the temporal noise, the image quality is significantly improved.

When readout circuit 34' of photodiode 32 is shared with a photodiode 36 (in dotted lines in FIG. 10), for example, in the case of FIG. 9, a second transfer transistor TG' is arranged between photodiode 36 and follower transistor TS.

Transistors TG and TG' may be actuated simultaneously or successively, according to the envisaged read mode, that is, simultaneous or sequential. In the case of a sequential reading, this requires two samplings of the noise level of capacitance $C_{SN}$, one before each transfer.

The anodes of photodiodes 32, as well as the anodes of photodiodes 36, are preferably connected to a same potential (a line common to all pixels). The voltage set at the anodes of photodiodes 36 may be different from that set at the anodes of photodiodes 32.

It can be observed that omitting substrate 30 of the detector of FIG. 9 provides an alternative color image sensor capable of detecting visible and near-infrared radiation. This sensor is then only based on silicon. It thus does not aim at a high detection performance in near-infrared, unlike the previous embodiments. It however aims at a great simplicity of manufacturing.

Figure 11:
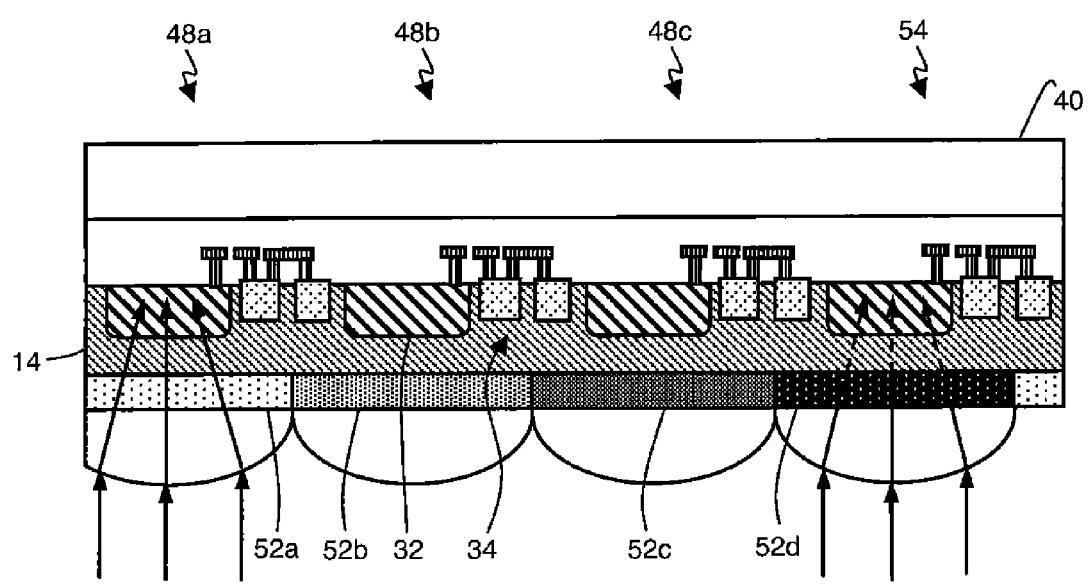
FIG. 11 represents four pixels of a variant of the color detector of FIG. 9.

FIG. 11 represents this variant of the color image sensor. The sensor comprises four pixels provided with pigmented resin filters 52a-52d. Three pixels 48a-48c are associated with the RGB elementary colors and one pixel 54 is dedicated to near-infrared due to filter 52d, opaque to visible radiation. Each pixel comprises a photodiode 32 formed in silicon substrate 14 and a readout circuit 34 of photodiode 32. The sensor may be indifferently illuminated from the frontside or from the backside of substrate 14. In the case of a backside illumination (FIG. 11), substrate 14 is preferably thinned, and then reinforced by a support substrate 40 arranged on the frontside.

This sensor has an operation similar to that of FIG. 9. The near-infrared component captured by pixel 54 may be subtracted from the signals of pixels 48a-48c for a day vision. In night vision or for a low lighting vision, part of the near-infrared radiation (700 nm-1 µm) is captured by the silicon photodiodes, but the sensitivity is low. This however enables to obtain an image in the absence of visible light or to increase the sensitivity for a low lighting level. The absorption of near-infrared may further be improved by the use of a thicker substrate 14, for example, between 5 µm and 15 µm.

Article ["A day and night MOS imager spectrally adjusted for a wide range of color", Koyama et al.; Sensors, cameras, and systems for industrial/scientific applications X, 2009] also describes a visible and near-infrared image sensor in silicon technology. However, the filters used are of interference type and comprise a large number of stacked layers. They are of a different nature than the interference filters described in relation with FIG. 6, since they have to let through near-infrared instead of blocking it. Such filters are complex to design and to produce.

The sensor of FIG. 11 however uses easy-to-form pigmented resin filters. A visible and near-infrared sensor can thus be obtained at low cost.

A method for producing the visible and near-infrared detector according to FIG. 3, 4, 6, 7, 8, or 9 is described hereafter. This method is inspired from the technique described in relation with FIGS. 1 and 2.

A substrate 30 comprising photodiodes optimized for near-infrared detection is formed. The NIR photodiodes are preferably made in an InGaAs layer formed by epitaxy on an InP layer. A metal layer is then deposited on the InGaAs layer, on the frontside of substrate 30, to form a contact metallization of the NIR diodes (cathodes). The connection of the anodes of the NIR photodiodes on the backside of substrate 30 (InP layer) is preferably transferred to the frontside by a metallization on an edge of substrate 30.

A silicon-based substrate 14, preferably of SOI type, is used to form visible photodiodes 32 and transistors 20, according to CMOS technologies. An interconnect layer 28 is then formed on the frontside of substrate 14 to connect the transistors to photodiodes 32. Interconnect layer 28 conventionally comprises several metallization levels covered with dielectric material. The last metallization level is not covered with dielectric material. A metallization thus remains exposed at the frontside of substrate 14.

Substrates 30 and 14 are then placed into contact by their frontsides and assembled by metal-to-metal bonding. The bonding is performed between the last metallization level of layer 28 and the contact metallization of the NIR photodiodes.

Preferably, InP and InGaAs-based substrate 30 is reinforced by a support substrate and silicon-based substrate 14 is thinned by etching or by chemical mechanical polishing. In the case of etching, the buried oxide of the SOI substrate is advantageously used as a stop layer.

Finally, filters (made of pigmented resin or interference filters) and microlenses may be formed on the backside of substrate 14, in correspondence with the visible and near-infrared photodiodes.

Figure 1:
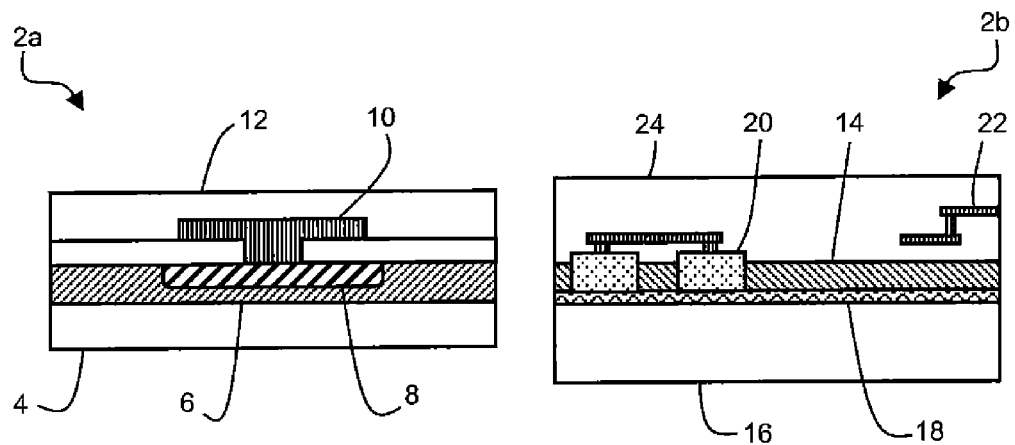
FIG. 1, previously described, represents two portions of a near-infrared sensor according to prior art.
Figure 2:
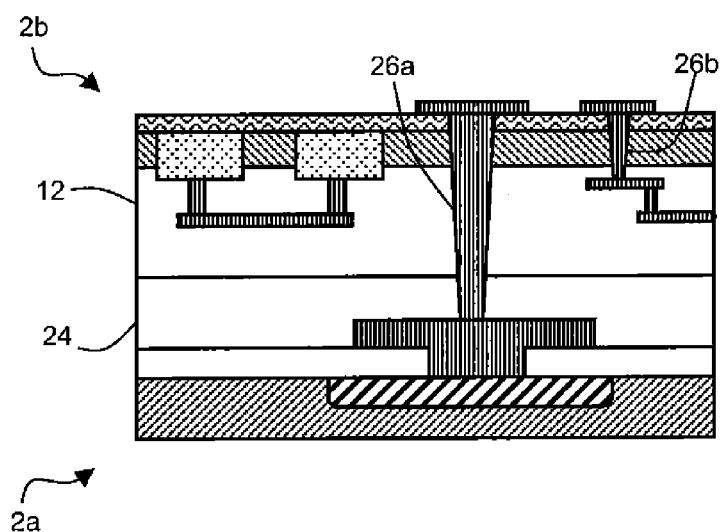
FIG. 2, previously described, represents a near-infrared sensor obtained by assembling the portions of FIG. 1.

In FIGS. 1 and 2, the connections between the NIR photodiodes and the readout circuits are achieved by vias made on the backside and by an additional metallization level formed on the backside of substrate 2b.

In the above-described method, the interconnection of the NIR photodiode and of the readout circuit of substrate 14 is formed on the frontside. It is thus avoided to manipulate again the backside of the sensor to form additional interconnection vias and metal tracks.

Many variants and modifications of the embodiments described herein will occur to the person skilled in the art. For example, the material of the near-infrared detection layer is not limited to InGaAs. Other semiconductor materials having a bandgap smaller than 0.8 eV may be used, such as for example, cadmium mercury telluride (CdHgTe), germanium (Ge), and silicon-germanium (SiGe).

We claim:

1. A detector of visible and near-infrared radiation comprising:
    a layer of a material optimized for near-infrared detection;
    a near-infrared photosensitive element formed in the layer of the material optimized for near-infrared detection;
    a silicon substrate having a frontside covered with the layer of the material optimized for near-infrared detection;
    a first readout circuit for reading the near-infrared photosensitive element, formed on the frontside of the silicon substrate;
    four visible photosensitive elements, formed in the silicon substrate, one of the visible photosensitive elements being arranged in front of the near-infrared photosensitive element; and
    three interference filters respectively associated with three elementary colors and arranged at a backside of the silicon substrate to define a pixel quadruplet, each interference filter comprising an alternation of metal layers and of dielectric layers,
    wherein a first pixel of the pixel quadruplet, comprising the near-infrared photosensitive element and one of the visible photosensitive elements, is devoid of interference filter, and the three other pixels of the pixel quadruplet, respectively comprising the three other visible photosensitive elements, are respectively provided with the three interference filters, and
    the near-infrared photosensitive element of the first pixel extends over one of the three other pixels.

2. The detector according to claim 1, wherein the first readout circuit is common to the visible and near-infrared photosensitive elements of the first pixel.

3. The detector according to claim 1, further comprising a second readout circuit for reading the visible photosensitive element of the first pixel separate from the second readout circuit for reading the near-infrared photosensitive element.

4. The detector according to claim 1, comprising a near-infrared photosensitive element formed in the layer of the material optimized for near-infrared detection in one of the three other pixels.

5. The detector according to claim 1, comprising four near-infrared photosensitive elements formed in the layer of the material optimized for near-infrared detection, respectively facing the four visible photosensitive elements.

6. A method for producing a visible and near-infrared detector comprising the steps of:
    providing a layer of a material optimized for near-infrared detection provided with a near-infrared photosensitive element;
    forming a contact metallization of the near-infrared photosensitive element on a frontside of the layer of the material optimized for near-infrared detection;
    providing a silicon substrate provided with a visible photosensitive element;
    covering the frontside of the silicon substrate with an interconnect layer while leaving a last metallization level exposed; and
    placing into contact the frontsides of the layer of the material optimized for near-infrared detection and of the silicon substrate to perform a metal-to-metal bonding of the last metallization level of the interconnect layer with the contact metallization of the near-infrared photosensitive element.

* * * * *